US006868519B2

United States Patent
Beacken et al.

(10) Patent No.: US 6,868,519 B2
(45) Date of Patent: Mar. 15, 2005

(54) REDUCING SCINTILLATION EFFECTS FOR OPTICAL FREE-SPACE TRANSMISSION

(75) Inventors: Marc J. Beacken, Township of Randolph, County of Morris, NJ (US); Alex Pidwerbetsky, Township of Randolph, County of Morris, NJ (US); Dennis M. Romain, Morristown, NJ (US); Richard R. Shively, Convent Station, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 628 days.

(21) Appl. No.: 09/839,486

(22) Filed: Apr. 23, 2001

(65) Prior Publication Data

US 2002/0157060 A1 Oct. 24, 2002

(51) Int. Cl.[7] .................. H03M 13/00; H03M 13/03; G06F 11/00
(52) U.S. Cl. ................ 714/762; 714/701; 714/761; 714/787; 714/788
(58) Field of Search .................. 714/701, 702, 714/761, 762, 787, 788

(56) References Cited

U.S. PATENT DOCUMENTS

| | | | |
|---|---|---|---|
| 5,063,533 A | | 11/1991 | Erhart et al. |
| 5,889,791 A | | 3/1999 | Yang |
| 5,907,563 A | * | 5/1999 | Takeuchi et al. ............ 714/751 |
| 6,075,824 A | | 6/2000 | Trost et al. |
| 6,313,932 B1 | * | 11/2001 | Roberts et al. ................ 398/9 |
| 6,625,763 B1 | * | 9/2003 | Boner ........................ 714/701 |

* cited by examiner

Primary Examiner—Joseph D. Torres

(57) ABSTRACT

A process and apparatus is described for recovering from optical transmission degradation due to scintillation effects in optical free space. A payload bit stream is encoded into Reed-Solomon codewords. These are fragmented and distributed as interleaved segments over a cell matrix of a SDRAM buffer store which is made large enough to correct a burst error occurring over 20 million consecutive bits. The rate imbalance between conventional read vs. write operations for SDRAM devices, which would otherwise obviate their use in this application by preventing real time operation, is overcome by an address remapping that avoids having to changing page addresses each time SDRAM memory is referenced. The remapping facilitates a more nearly equal allocation of READ overhead and WRITE overhead. An optical communications system employs at both the transmit and receive ends, substantially equivalent SDRAM buffer with address remapping capability.

13 Claims, 9 Drawing Sheets

SUB-MATRIX MAPPING 60-BIT ENTRIES INTO FIRST SDRAM PAGE OF 512 ADDRESSES, USING 510 MATRIX CELLS TO STORE FIRST CODEWORD DURING WRITE OPERATION

SUCCESSIVE ADDITIONAL (APPROX. 10,416) SUB-MATRICES MAPPING FURTHER 60-BIT ENTRIES INTO SDRAM PAGES TO STORE SECOND THROUGH $m^{th}$ CODEWORDS DURING WRITE OPERATION

SDRAM BUFFER STORE 22

| 1,1 | 2,1 | 3,1 | ... | 15,1 | ... | 16,1 | ... | 156250,1 |
| 1,2 | 2,2 | 3,2 | ... | 15,2 | ... | 16,2 | ... | 156250,2 |
| ... | ... | ... | ... | ... | ... | ... | ... | ... |
| 1,34 | 2,34 | 3,34 | ... | 15,34 | ... | 16,34 | ... | 156250,34 |

27

CODEWORD SEGMENTS EXPRESSED AS A MATRIX

FIG. 6B

IF RECEIVED WERE STORED SEQUENTIALLY AT THE RECEIVER A PHYSICAL PAGE CHANGE WOULD BE REQUIRED EVERY MEMORY REFERENCE TO COMPLETE THE DE-INTERLEAVING

SDRAM BUFFER STORE 52

| 1,1 | 2,1 | 3,1 | ... | 512,1 | 513,1 | ... | 156250,1 |
| 1,2 | 2,2 | 3,2 | ... | 512,2 | 513,2 | ... | 156250,2 |
| ... | ... | ... | ... | ... | ... | ... | ... |
| 1,34 | 2,34 | 3,34 | ... | 512,34 | 513,34 | ... | 156250,34 |

CROSS-HATCHED SUBMATRIX INDICATES SEGMENT OF RECEIVED MATRIX THAT WOULD BE HELD ON ONE 512 ADDRESS PAGE IF RECEIVER STORED ENTRIES SEQUENTIALLY

FIG. 6C

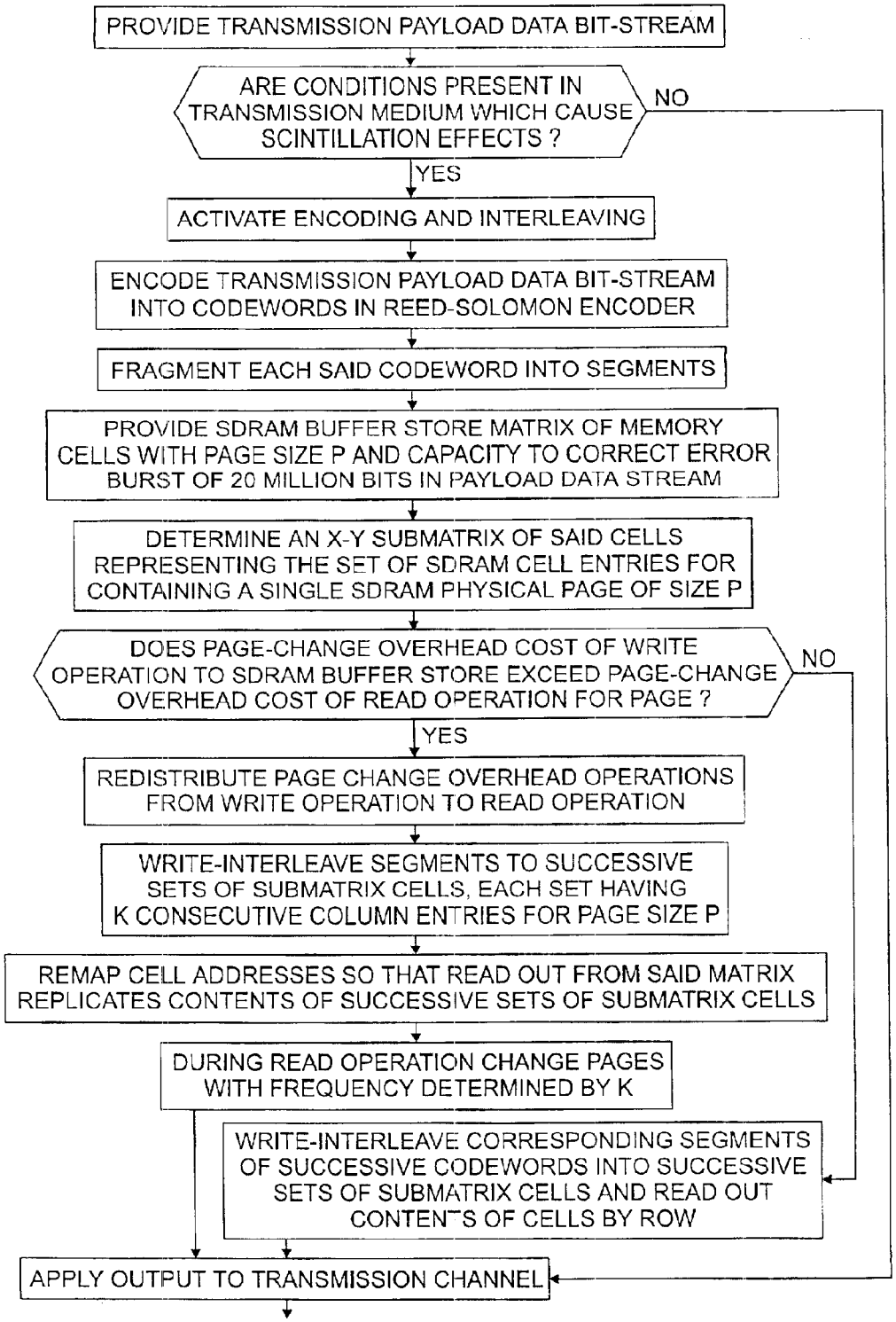
FIG. 7A — FLOW CHART OF PROCESS AT TRANSMITTER END

FLOW CHART OF PROCESS
AT RECEIVER END

REDUCING SCINTILLATION EFFECTS FOR OPTICAL FREE-SPACE TRANSMISSION

BACKGROUND OF THE INVENTION

Optical free-space transmission is subject to degradation arising from the effects of scintillation in the transmission medium. Free-space optical signals experience fading from scintillation over times on the order of several milliseconds. During these times, a multi-gigabit/second signal may lose tens of millions of bits. For example, an 8 millisecond fade in a 2.5 gigabit/second data stream equates to the loss of 20,000,000 bits.

When a data stream is transmitted over optical fibers, block-oriented forward error correction (FEC) is widely used. However, the degradation arising from scintillation effects in free-space optical transmission can last for millions of bits compared to the typically far shorter duration of error bursts in optical fiber media. The single-block FEC error correction process therefore is extremely impractical in correcting errors of the lengths that occur in free-space optical transmission. Addressing the problem resulting from scintillation effects by selective re-transmission of affected blocks is also not practical for such large error bursts, due to the real-time nature of communication processes such as video.

The practice of interleaving, or shuffling, data streams is used to achieve greater robustness and noise reduction in many communications applications. The general principle, as stated in the publication "Error Correcting Codes", W. Peterson and E. J. Weldon, MIT Press (1972), p. 371, (which is hereby incorporated by reference) is that a t-error-correcting code interleaved to degree i is capable of correcting all single bursts of length i*t or less. Through interleaving, the burst error can be made to have the effect of many isolated errors, provided that the data is interleaved over a span large compared to the burst duration.

Interleaving is therefore a candidate for error-correction of scintillation effects in optical free-space transmission, since in theory it can correct for error bursts that last for tens of millions of consecutive bits. However, in correcting tens of millions of bits in a burst error within a single code block, the communication terminal requires an extraordinarily large encoder/decoder and buffer store under current terminal design concepts. Considerations of cost, size, and power consumed by the scintillation effect error-correction apparatus must be constrained in realizing a commercially practical communication terminal.

Synchronous-dynamic-random-access-memory (SDRAM) devices are available that can provide a practical means of realizing the large permutation matrix capacity required to interleave. However, the SDRAM rows, or "pages", typically incur a significant, multi-cycle overhead cost whenever it is necessary to change the row address, i.e. change "pages". The column address field typically equates to the low order digits in the physical address of the SDRAM, such that when addressing consecutive or grouped sets of data, a minimum of page changes is incurred. If the SDRAM devices were addressed in a straightforward way, namely storing segments of the block FEC codeword in successive addresses, then reading-out of the codeword sequence in permuted order to effect the interleaving requires changing page addresses each time the memory is referenced, due to the large address increments required. An analogous process is that of storing a matrix with row elements in successive addresses, then reading the matrix by column. Address increments equal to the row length would be required in reading the transposed matrix.

More specifically, in a suitable SDRAM device grouping arranged to provide buffer store for the large permutation matrix needed for interleaving and de-interleaving, a large number of cycles (7 for example) are required to change page addresses. The result of straightforward addressing then is a seven-fold reduction of the effective memory speed. The high bit rates involved in optical communications already mandate using the fastest SDRAM devices available to perform this interleaving process. Therefore, such a slowdown would impair the practicality of using SDRAM devices to implement a process of overcoming scintillation effects in optical free-space transmission.

SUMMARY OF THE INVENTION

This invention provides a process and apparatus for encoding-interleaving and deinterleaving-decoding an optical data stream which overcomes transmission degradation from scintillation effects. A burst error of the magnitude of 20 million consecutive bits can be masked at an affordable cost in components and a negligible cost in added latency.

Using (255,223) Reed-Solomon coding, a payload bit stream is encoded into codewords and the resulting codewords are fragmented and distributed over a permutation buffer, where they are interleaved with other codewords, over a span sufficiently large that a burst error E-bits in duration will effect at most b-bits in any codeword where, for example, E/b=156,250.

The invention in one embodiment uses SDRAM devices for permutation buffers. However, the invention overcomes the limitations of the typical SDRAM device when used to provide large array permutations, by using an address remapping that essentially equalizes the READ vs. WRITE rates. In accordance with this aspect of the invention, unique advantage is taken of a characteristic of state-of-the-art SDRAM devices, that one can READ or WRITE the devices at the device cycle rate within a page (i.e. row).

In the matrix transpose used during loading of the SDRAM buffer in the interleaving process at the transmit end, and in the deinterleaving process at the receive end, address re-mapping is applied when the number of columns that can be stored in one page is too small—that is, when the overhead cycles of the SDRAM devices amortized over the number of memory references that can occur (as a row is read) before a page change, leads to an effective memory cycle rate that does not meet system requirements.

Address remapping in accordance with the invention redistributes overhead operations from WRITE to READ, which permits essentially realtime operation with a minimum of elastic memory. Thus, as matrix entries are received by row, a physical SDRAM page change occurs for example—every 15 entries instead of every 512 entries. The result is that the overhead associated with row-address changes is made roughly equal in both the WRITE (i.e. input to the permutation buffer) and READ (read-out of the permutation buffer). In this way the overhead cycles are amortized over a large number of memory references for both the READ and WRITE process, such that the effective memory cycle rate asymptotically approaches the burst physical cycle rate.

The invention thus solves the problem of economically managing the very large interleaving or permutation span required to cover error bursts in optical free-space communications of the order of 20 million bits, which would result, for example, if an 8 millisecond fade occurred during a 2.5 gigabit/sec. transmission.

Although the invention is described in an illustrative embodiment involving optical free-space communications, the invention also has applicability to, for example, RF wireless communications systems (e.g. millimeter wave). As such systems operate at higher and higher data rates, the fades they experience also create lost megabits. Using the methods and apparatus hereinafter taught, the megabits lost in fades in RF wireless communications may be recovered.

DETAILED DESCRIPTION OF THE DRAWING

FIG. 6B is a diagram illustrating another exemplary way to remap SDRAM addresses to balance "READ" vs. "WRITE" overhead;

FIG. 6C is a diagram illustrating consequences of holding a received matrix on one 512-address page if receiver stores entries sequentially;

FIG. 7A is a flow chart of the process including address remapping at the transmit end.

ILLUSTRATIVE EMBODIMENT

Figure 1:
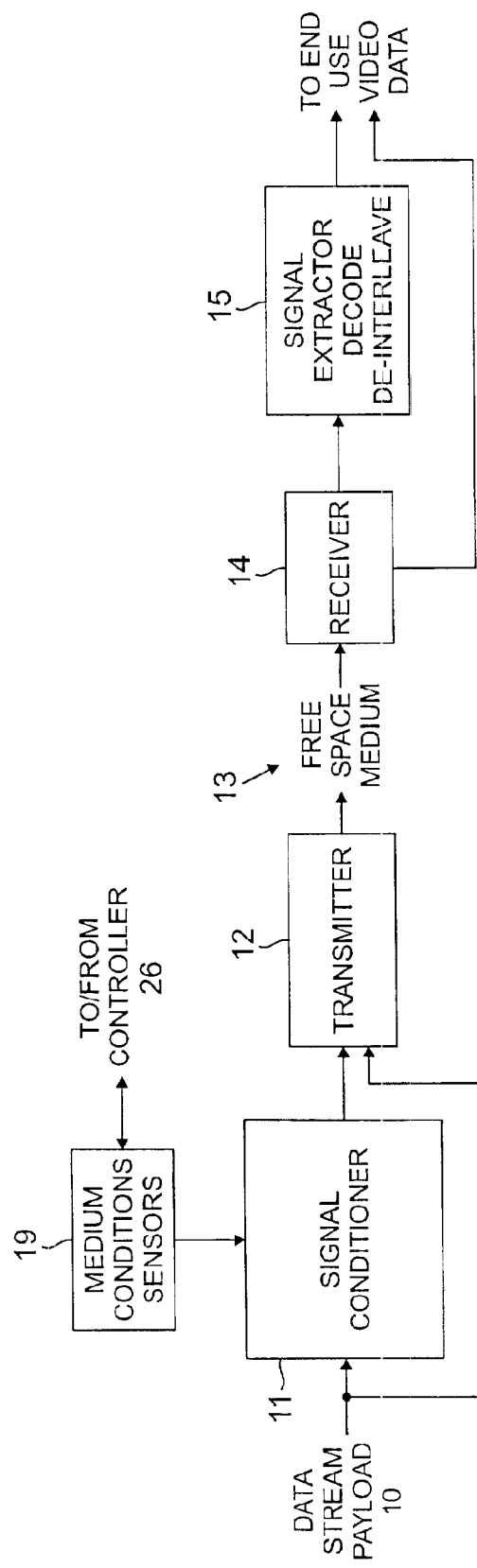
FIG. 1 is a schematic block diagram of an optical free-space communication system.

In the exemplary embodiment described below, the principle of interleaving moderately sized burst-error correction code blocks is used, but on a macro scale much larger than conventionally applied, such that the interleaving for the examples illustrated spans hundreds of millions of bits in order to support recovery from burst errors on the order of tens of millions of bits. Synchronous Dynamic Random Access Memory (SDRAM) device technology is used by way of example, to make it feasible and economical to support the extremely large memory arrays that are required to implement such a process. The large row-column random access overhead, which is universal with SDRAM technology, is substantially reduced by an address remapping of physical addresses. The effect of the address remapping is that overhead cycle bursts are distributed rather than occurring in clusters of consecutive memory references, which is typical when a straightforward use of memory address space is applied. This allows the invention's high-speed memory reference rate to be maintained with minimal elasticity in the data flow.

The process involves first conventionally encoding the data stream into codewords or blocks each of n bits comprising k payload bits and (n−k) error-correcting-code-bits. The process then defines the maximum number of errors that can be corrected within a codeword as b, taking into account that the maximum number of bits that can be corrected by any linear code is:

$$b=0.5*(n-k). \qquad \text{(equation 1)}$$

and this limit is attained for selected instances of Reed-Solomon coding.

Assume an example Reed-Solomon code of (255,223), which means the code word is 255 symbols in length, of which 223 are payload symbols, 255−223=32 are check symbols, and the symbol is an eight-bit octet. The bound of correctable symbols indicated by equation 1 that is achieved for this example, is up to 0.5* (255−223)=16 symbols. This means the codeword size in bits is 8*255=2040 for this example; and that an error burst in one codeword of up to b=16×8=128 bits can be corrected.

If the objective is to mask error bursts of duration E bits, the number of codewords, M, that must be interleaved is:

$$M=E/b. \qquad \text{(equation 2)}$$

Thus, correcting an error burst of the order of 20 million bits would require interleaving $$M=20\times10^6/128=156{,}250 \text{ codewords.}$$

The span of the interleaving (that is, the dimension of the permutation matrix, i.e. size S of the buffer required and hence the duration of the latency added by this process) is:

$$S=M*n. \qquad \text{(equation 3)}$$

For the above example, M is 156,250; and n (expressed in bits) is 2040, such that a buffer store of M*n=3.1875×10$^8$ bits is required.

The effects of scintillation degradation in free-space optical transmission can vary as a function of many ambient conditions. For example, for a point-to-point optical range of 4.4 km. and a crosswind on the order of 10 mph, the temporal correlation of scintillation is on the order of 15 milliseconds. For a range of 1 km. and 10 mph. crosswind, the time scale is 7–8 milliseconds. If the crosswind is on the order of 20 mph. in the range of 1 km., the temporal correlation becomes about 4 milliseconds. The extent of scintillation effect also varies as a function of other atmospheric conditions including, for example, air temperature, emissions and relative humidity. The onset of scintillation conditions can also be determined by the monitoring of the received signal of the reverse path of a free space optical link.

The invention is illustrated as part of an optical free-space transmission system seen in FIG. 1. The system receives at an input end a data stream payload 10. The payload may be in the form of a continuous data stream; or may comprise data bursts where the bit-length of the payload may vary from burst to burst.

The burst-error correction process may be applied unconditionally and continuously to all data transmitted; or may be selectively applied when certain free-space conditions such as just described are detected, for example, by sensors 19. Sensors 19 are linked to computer controller 26, where instructions contain threshold values which determine whether the free-space scintillation conditions are present. If the free-space medium conditions are occurring, data stream payload 10 is routed through signal conditioner 11. Here, the data is encoded and interleaved into a buffer store in a manner to be described. The output of signal conditioner 11 is transmitted by transmitter 12, for transmission through free-space medium 13 to a receiver 14. If the received signal has been conditioned for scintillation, it is fed to signal extractor 15 for deinterleaving and decoding before being routed for end use in, for example, video or high-speed data applications.

Figure 2:
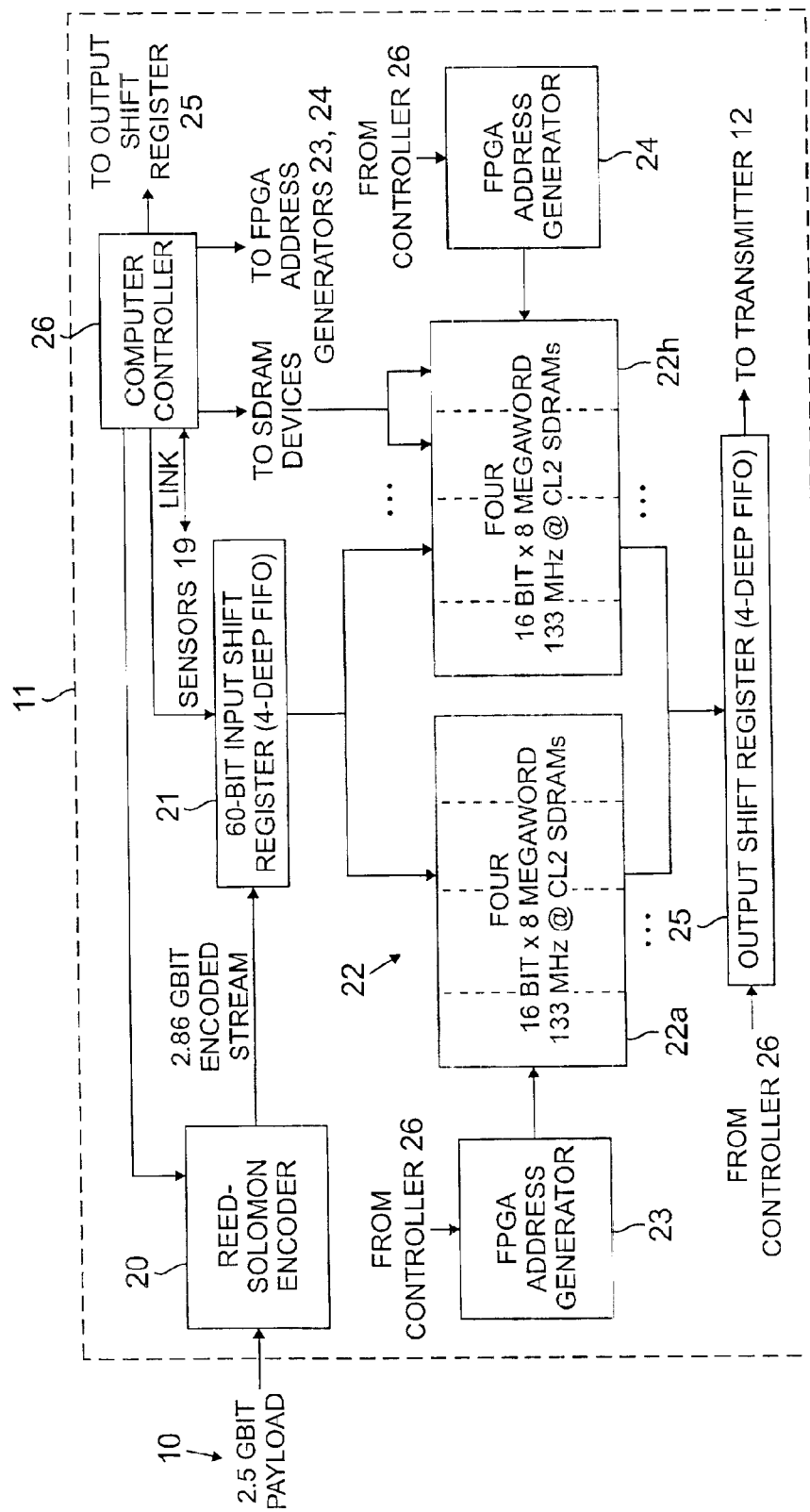
FIG. 2 is a schematic block diagram illustrating a transmitter-end system and components to perform the invention.
Figure 3:
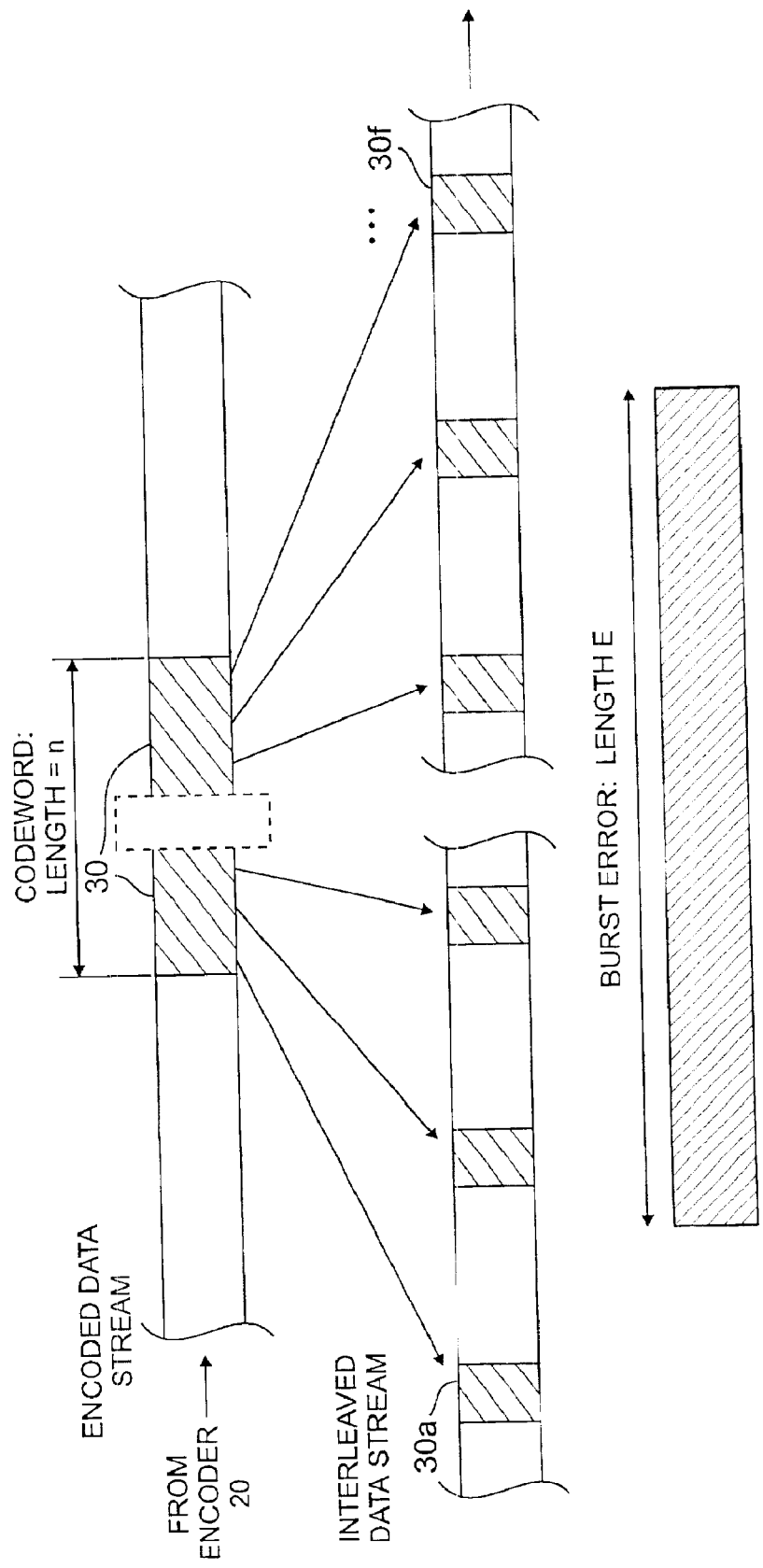
FIG. 3 is a diagram illustrating segmenting of codewords to prepare for interleaving.

Referring now to FIG. 2, signal conditioner 11 comprises encoder 20 which preferably is of the (255,223) Reed-Solomon type. A data stream payload 10 of 2.5 gbit is fed to Reed-Solomon encoder 20, which outputs a 2.86 gbit stream in this illustrative embodiment. Preferably, Reed-Solomon coding is used having a Galois Field of 8-bit symbols and a (255,223) code configuration. Reed-Solomon coding is comprehensively described in the afore-mentioned text "Error Correcting Codes"s, Peterson and Weldon, 1992. Encoder 20 encodes the payload data stream 10 into codewords, each of length n as seen in FIG. 3. An exemplary codeword 30 is split into the desired number (for example, 30) of codeword fragments, of which for convenience only six fragments 30a–30f are shown. The next codeword then is similarly fragmented into 34 fragments; and these latter fragments are interleaved with the previous thirty-four fragments. The interleaving of codewords occurs over a span sufficiently large that the burst error of length E bits will affect at most b bits in any given codeword. Methodologies for effecting the interleaving are well-known, one example being described in U.S. Pat. No. 5,889,791 which is hereby incorporated by reference.

Figure 4:
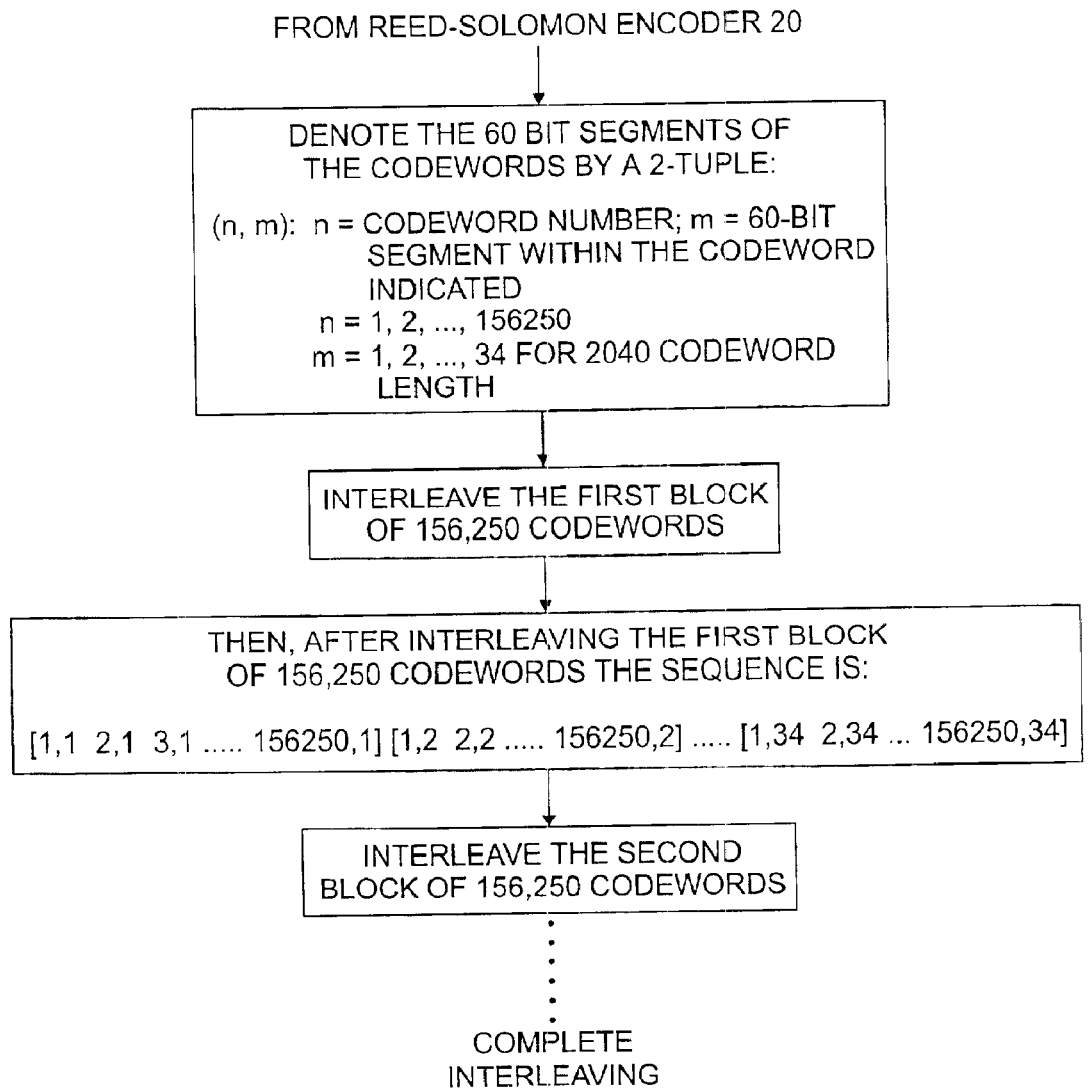
FIG. 4 is a flow chart showing a protocol for interleaving blocks of codeword segments.

FIG. 4 shows a sequence of steps by which segments of each codeword may be denoted by a 2-tuple where n is the codeword number and m is a 60-bit segment within the denoted codeword. After being labeled, the first block of 156,250 codewords are interleaved into cells of buffer 22. After interleaving of this first block of 156,250 codewords, the codeword sequence is shown by the bracketed number sequences, which reveal the writing of "column entries" for subsequent READOUT as rows. In the same way, the second block of codewords and beyond, are interleaved. Consecutive entries from the same codeword are separated by 60×156,250=9.375 megabits. Thus, an erasure or loss of any two of the bracketed sequences (each being 9.375 megabits) incurs no more than 120 bits of error in any codeword.

Retuning to FIG. 2, a 60-bit input shift register 21 receives the encoder 20 output. Sixty-bit segments of the codeword are chosen because 60 is an integer factor of 2040 and 60 bits×156,250×2 is close to the nominal 20 megabit burst-error length objective of 18.75 megabits. A burst error of 18.75 million bits would destroy two 60-bit segments (120 bits) in each of 156,250 interleaved codewords, but because all of the codewords have the capability of correcting 128 bits, all the data would be recovered in the example.

Input shift register 21 distributes the fragments created in encoder 20 to a buffer store 22 comprising a bank of eight SDRAMs 22a . . . 22h, ganged in groups of four. The SDRAMs are 16 bit×8 megaword stores. The SDRAM devices are loaded in accordance with addresses supplied by Field Programmable Gate Array (FPGA) configured as address generators 23, 24. The operation of buffer store 22, and FPGA address generators 23, 24 are directed by computer controller 26. READOUT from the SDRAM devices is to output shift register 25, which feeds transmitter 12 with a stream of encoded and interleaved bits. A substantially identical buffer store 52 at the receiver is used to deinterleave; and is described hereinafter and in FIG. 5.

The encoding processes of encoder 20, the addressing functions of address generators 23, 24 the storage functions of SDRAMs 22a . . . h, and the operation of input and output shift registers 21,25 may be performed in separate hardware components with functionalities coordinated by instruction code run in computer controller 26 shown in FIG. 2. If hardware is preferred, suitable commercially available components are: Vitesse Semiconductor VSC 7146 device for the shift registers 21, 25; and Lucent Technology's ORCA FPGA ORT8850 components for the address generators 23, 24. The functions of address generators 23, 24 and input shift registers 21,25, as well as encoder 20, may alternatively be provided as code instructions under the control of computer controller 26.

In the present example, the Reed-Solomon code uses a Galios Field of 8 bit symbols and a (255–233) code. Thus, a codeword is 255 octets (bytes) in length, of which 223 are payload, with the remaining 32 as check symbols. The code has the capability of correcting 32/2 or 16 bytes of error. This means that as few as 16 isolated errors (i.e. if each error were in a different octet) could be corrected; but that as many as 16×8 or 128 bit errors would be corrected in any block if the errors all occurred within 16 bytes.

From an exemplary field measurement of free-space optical transmission over a 10 km range, roughly 90% of the fades were of duration less than 8 ms. A data stream bit rate of $2.5 \times 10^9$/sec. would yield a value of $E = 20 \times 10^6$ bits lost during an 8 ms. fade. Since at most 128 bits of any codeword can be lost due to the burst error and still mask the burst, the number of codewords that must be interleaved in this example is:

$$E/b = 2 \times 10^7 / 128 = 156,250 \qquad \text{(equation 4)}$$

Since the codeword is 255×8=2040 bits long, the interleaving buffer store 22 size is:

$$(E/b)*n = 156,250 * 2040 = 318,750,000 \text{ bits} \qquad \text{(equation 5)}$$

A buffer store of this size may be realized by using SDRAMs of 128 or 256 megabits in size.

The WRITE process to SDRAM devices in buffer store 22 requires forming 60-bit words in 20.8 ns. (60 times the bit period of the $2.8 \times 10^9$ bit/sec. encoded data stream). Performing interleaving in a straightforward manner involves writing entries at address increments of 156,250 (i.e., matrix column entries), then READING out consecutive addresses (rows) to transmit the interleaved codewords. Parameters peculiar to state-of-the-art SDRAM devices make this difficult, because of latency effects vis-a-vis isolated READ or WRITE operations. With SDRAM devices with a CAS-latency of 2, the maximum rate of writing into distinct rows (pages) of the SDRAMs is once every 7 cycles. This is exemplified by the characteristics of the Micron Technologies SDRAM device no. MT48LC8M16A2. More information on this and similar SDRAM devices from Micron Technologies Inc. may be obtained at their WebSite at http://www.micron.com Other manufacturers also produce SDRAM devices; and it is understood that all such similar devices may be adapted by persons skilled in the art to practice the invention.

In order to realize performance with the minimum of overhead operations in the SDRAM devices, it is desirable to use Class-2 SDRAM with a maximum clock rate of 133 MHz., or 7.5 ns. cycle time. However, this seven cycle WRITE epoch associated with the SDRAM devices of buffer store 22 is not compatible with 20.8 ns. READOUT rate at which new 60-bit codeword segments are being generated.

To overcome this incompatibility, the invention takes unique advantage of a characteristic of the state-of-the-art SDRAM devices, which is that one can READ or WRITE to the devices at the device cycle rate within a page (i.e. row). To illustrate: for the Micron Technologies SDRAM, device no. MT48LC8M16A2 noted earlier (with 16 bits×2M×4 banks) the page size is 512 sixteen-bit words, and the clock rate is 133 MHz. (7.5 ns.). If these devices are addressed in a conventional fashion, they would require 7×7.5=52.5 ns. per WRITE, because the WRITE address increments far exceed the page size. However, consecutively addressed READ operands can asymptotically be performed at a 7.5 ns. rate, which is well under the 20.7 ns. rate required for real-time transmissions.

Figure 6A:
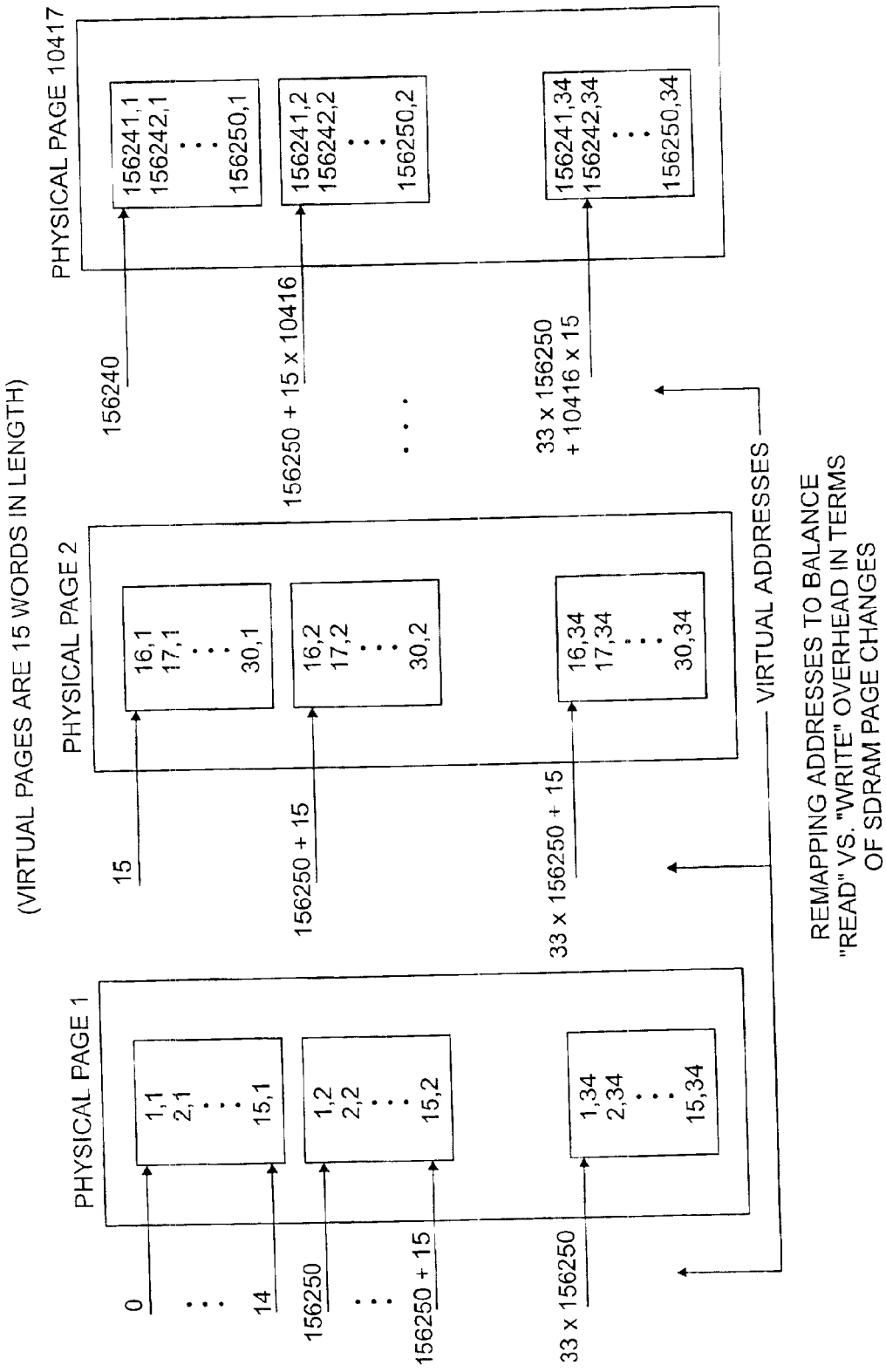
FIG. 6A is a diagram illustrating remapping of addresses in SDRAM matrix to balance "READ" vs. "WRITE" overhead in terms of SDRAM page changes.

The general remapping strategy therefore is to equalizing "READ" vs. "WRITE" rates. Essentially, the idea is to regard each page in SDRAM memory as multiple "virtual" pages; and exploit the fast WRITE rate on the same (physical) page in exchange for requiring a more frequent page change during READ in the permutation operation. Referring to FIG. 6A, the general approach is to WRITE K consecutive entries into one physical page, with the result that the READ process must then change pages [K] times as often compared with simply READING each P-entry page of SDRAM as a single sequence of consecutive addresses (where P is the page size).

For the numbers involved in the example, each physical 512-word SDRAM page is defined as consisting of 34 pages of 15 words each (two words are wasted). Since the permutation matrix is 34×150250 in size, the number 34 is selected to make indexing systematic.

The hardware and computer controls for effecting deinterleaving and decoding, and the determinations of when to effect address-remapping of the buffer stores 22 and 52, are next described.

Figure 5:
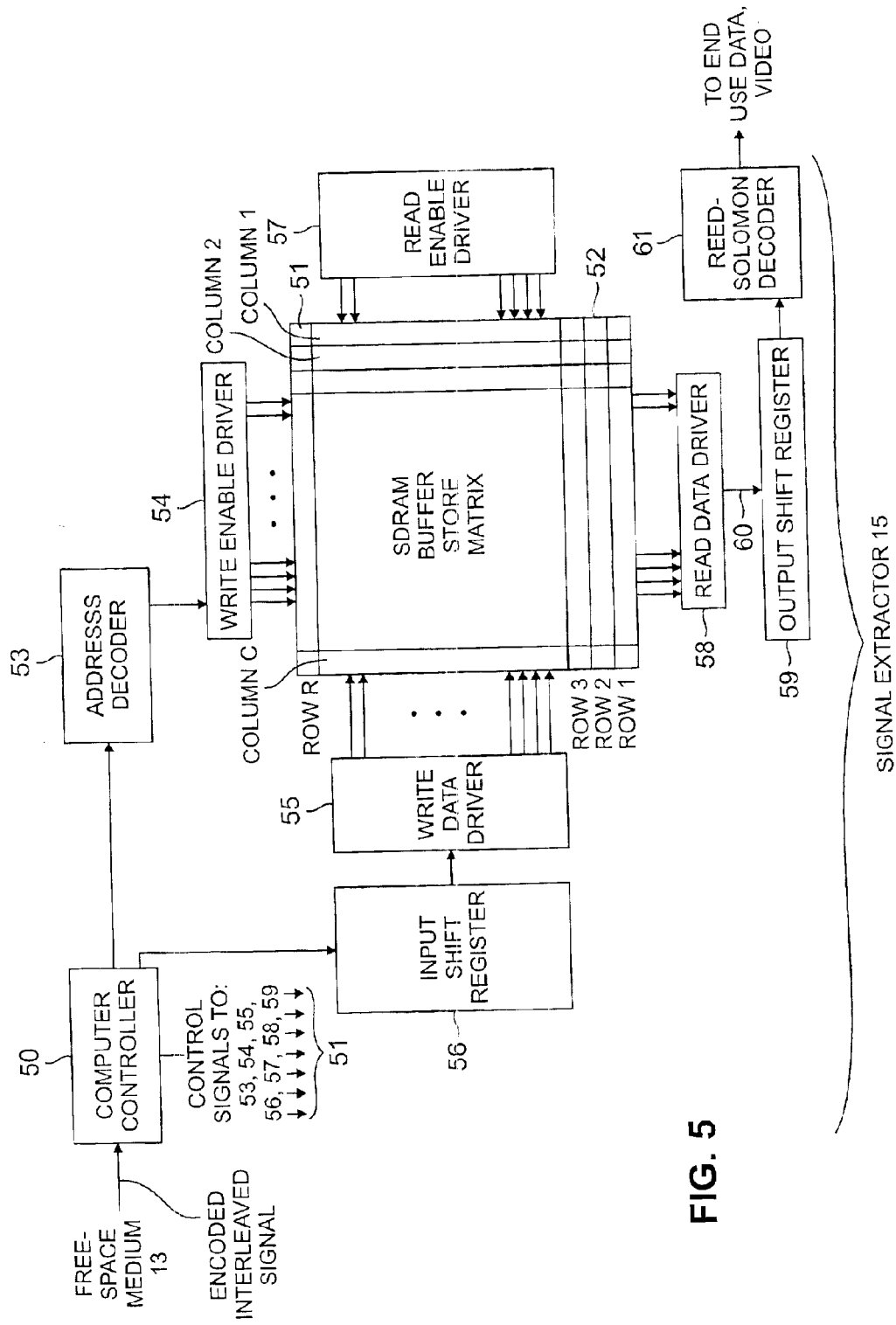
FIG. 5 is a schematic block diagram illustrating a receiver-end system and components to perform the invention.

Referring to FIG. 5, the signal extractor 15 at the receiver includes a computer controller 50 and an SDRAM buffer store 52 which may be substantially identical in construction to buffer store 22 at the transmitter. In FIG. 5, however, the buffer store is depicted as a matrix of memory cells such as cell 51, each cell being defined by the intersections of rows 1, 2, . . . , R and columns 1, 2, . . . , C. Computer controller 50 receives the encoded and interleaved signal 9 transmitted from transmitter 12 through free-space medium 13. An address decoder 53 controlled by computer controller 50 acquires the address information associated with each received interleaved codeword segment such as segment 30f in FIG. 3, and specifies the cell addresses in buffer store 52 into which the sequentially-received codeword segments are to be stored.

Each row of cells of buffer store 52 is served by a WRITE enable driver 54; and each column of cells of buffer store 52 is served by a WRITE data driver 55. Addresses to which to send the interleaved segments are supplied by address decoder 53 to WRITE enable driver 54. The received interleaved codeword segments are assembled in input shift register 56 and forwarded to WRITE data driver 55. Under control of WRITE enable driver 54, WRITE data driver 55 transfers segments to the memory cell matrix of SDRAM buffer store 52.

For READout, a READ enable driver 57 is connected to each row of memory cells. of SDRAM buffer store 52, and a READ data driver 58 is connected to each column of cells of SDRAM buffer store 52. READout from SDRAM buffer store 52 is preceded by determining in computer controller 50 whether the matrix of SDRAM buffer store 52, if mapped in the straightforward manner, will not slow down the process when read; or whether instead the need exists to remap the matrix to execute the deinterleaving in such a way as to equalize READ VS. WRITE rates. The READout data from Buffer store 22 is accumulated in output shift register 59; and the deinterleaved output data stream 60 is thereafter directed to Reed-Solomon decoder 61 which decodes the deinterleaved data stream. A deinterleaved and decoded data stream 62 is channeled from Reed-Solomon decoder 61 to an end use in video or data applications. Control signal paths, all denoted 51 for simplicity, are provided from computer controller 50 to the functions 53, 54, 55, 56, 57, 58 and 59.

For the deinterleaving, buffer store 52 is read by activating READ enable driver 57 to read data from the matrix accessed by READ data driver 58. Remapping of physical addresses where needed, is performed in accordance with the following criteria. In general, whether at the transmitter or the receiver, address remapping is performed when the number of matrix columns that can be stored in one page of SDRAM buffer store 52 is too small—which is the case when the overhead cycles amortized over the number of memory references that can occur (as a row is read) before a page change, leads to an effective memory cycle rate that does not meet system requirements. For the particular device speed parameters used in the herein example, the number of columns that must be held on one page must be 4 or greater. Because of the 7-cycle overhead when a page change does occur (at 7.5 ns/sec.) vs. the 20.8 ns. system cycle rate, a first-in, first-out elastic memory of 4 entries provides a means to bridge the page change. The 52.5 ns. interruption incurred by the page change is effectively masked with a backlog of 3 entries in the elastic memory.

The remapping of addresses in the matrix of buffer store 52 is illustrated in FIGS. 6A, 6B and 6C. (Remapping addresses in the matrix of buffer store 22 is accomplished in the same fashion as hereinafter described). Referring again to FIG. 6A, during the WRITE operation, entries 1,1 1,2 . . . 1,34 are stored in physical addresses 0,15, . . . ,495 of the first SDRAM page. However, these are treated during the READ operation as addresses 0, 156,250, . . . ,33×156,250 respectively. Because the factorization of addresses maps has the row length as one factor, exactly 15 rows of 34 entries in this example fit into one physical page. The "virtual" addresses illustrated in FIG. 6A, refer to the sequence in which the READout is performed to complete the permutation.

The remapping strategy is described below in terms of matrix transpose operations. For the above example's parameters of codewords 2040 bits in length factored into 34 sixty-bit entries for the purpose of interleaving, assume the 60-bit entries in the first codeword are denoted:

1,1 1,2 1,3 . . . 1,34 and in general the n'th entry in codeword m is denoted m, n.

In the above example which calls for interleaving corresponding entries from each of 156,250 codewords, the dimensions of the matrix are 34 rows×156,250 columns. If the matrix is written as in FIG. 6B, then at the transmitter end, the matrix is read in column order, and in this particular example, because of the short column dimension, it is not necessary to apply the address re-mapping at the transmitter. Fifteen columns of this matrix occupies one 512-address SDRAM page (15×34=510, and two addresses are skipped). Therefore, storing these first 510 entries on the first page, denoted 27 in FIG. 6B, during the WRITE operation results in an addressing pattern during the READout operation (i.e. as the transpose is being performed), wherein an SDRAM physical page change need only occur every 15 memory references as the matrix is read by row. That is, reading the successive submatrices following reading of submatrix 27 requires an SDRAM physical page change only every 15 memory references. This amortization of the page change overhead is sufficient to maintain real time operation for the example parameters.

However, at the receiver end the same matrix is received by row into the matrix of SDRAM buffer store 52. This matrix must be transposed effect a de-interleaving. If the received entries were written sequentially into SDRAM buffer store 52 as depicted in FIG. 6C, the result would be a page change every 512 memory references during WRITE, but the subsequent READ by column of the matrix would require SDRAM page changes every memory reference. This would mean that real-time operation could not be maintained with the example parameters.

The problem is overcome by the re-mapping of addresses. The same 34×15 submatrix dimensions as illustrated in FIG. 6B is replicated at the receiver end to redistribute overhead operations from WRITE to READ and therefore enable real time operation with a minimum of elastic memory. This means that as the entries are received by row, a physical SDRAM page change occurs every 15 entries instead of 512. After stepping writing 15 entries on each of 10416 such pages to store one entire row of the matrix (the last page holds 10 rather than 15 for these numbers), the next 15 entries are written on the first physical SDRAM page, such that each entry from the second row of the matrix appears on the same physical page as the corresponding first row, etc.

Exact equalization of READ and WRITE overhead advantageously involves choosing a square submatrix with dimensions equal to the square root of the page size. For the example parameters (512-word page size) this is not integer. Any submatrix dimensioning (where the submatrix represents the set of entries to be written on a single physical page) is satisfactory for which the minimum matrix dimension (representing the number of successive memory references that occur before a page change) is sufficient to amortize the SDRAM overhead for a page change. This amortization is dependent on the relationship of the maximum burst rate of the memory versus the transfer rate of new entries to be read or written. The excess of burst rate versus transfer rate must be sufficient to cover the overhead cycles. Thus, for the example with a 20.8 ns. entry receive or transmit rate, a 7.5 ns SDRAM rate on one page, and a 52.5 ns SDRAM page-change overhead, amortizing the overhead over 15 memory references is more than sufficient to maintain real time with an elastic store of 4 words.

The question of when in the general case the remapping is implemented, is dependent on the particular SDRAM device speed, the number of columns that must be held on one page (4 or greater in the above example), the data rate and other factors.

For example, the parameters of the above example require choosing a large data fragment, or word size, (60 bits) due to the high speed of the data stream and the need to thereby reduce the system clock rate to a value compatible with readily available memory and digital logic devices. As a consequence of the large word size the number of such words involved in decomposing the Reed-Solomon codeword of 2040 bits for purposes of interleaving is only 34. This does not provide a sufficient number of consecutive memory references between page changes to amortize the 7 cycle overhead, when the input words are stored in consecutive addresses; and hence address remapping is applied.

Figure 7B:
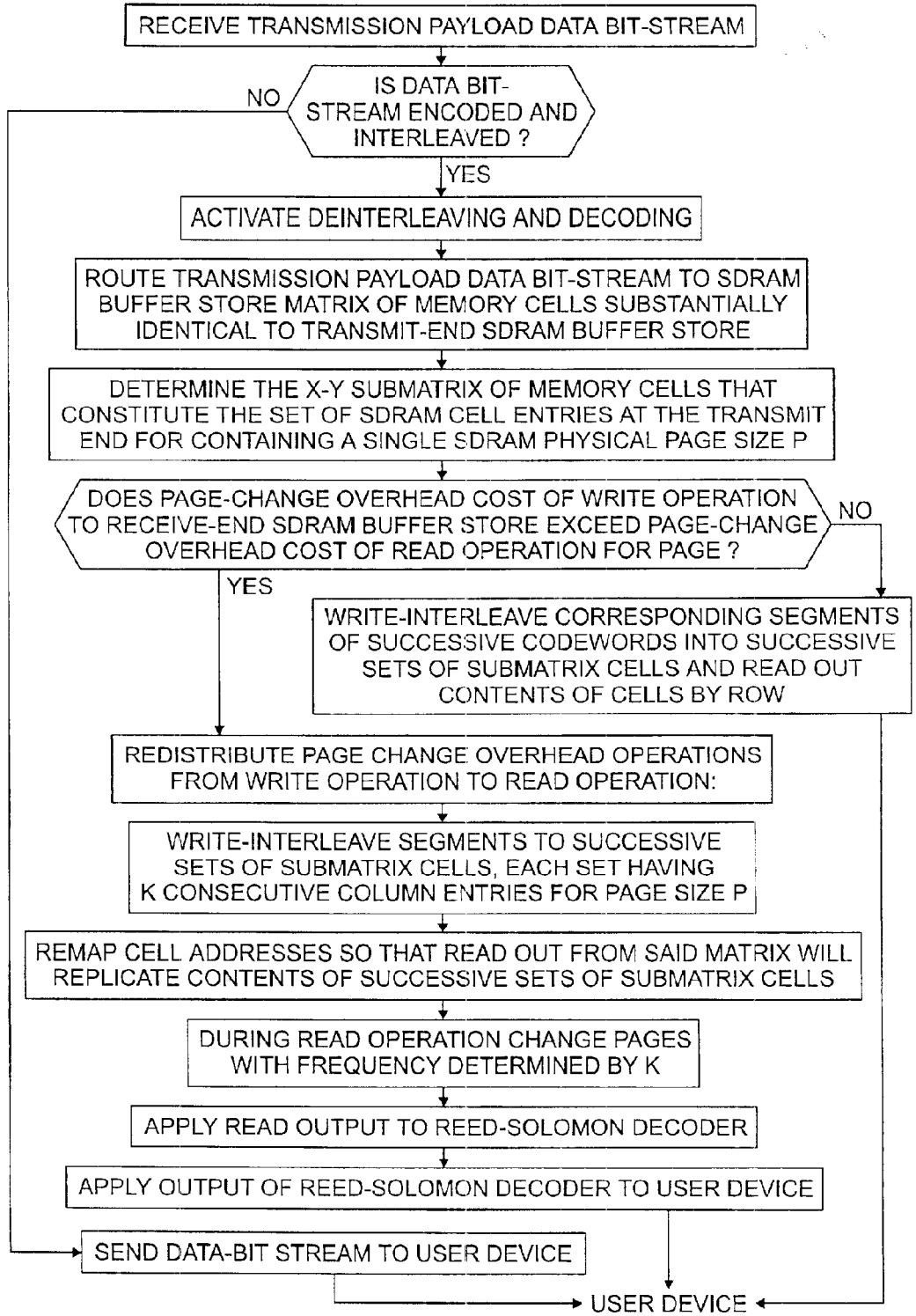
FIG. 7B is a flow chart of the process including address remapping at the receive end.

The flow chart of FIG. 7A summarizes the key process steps described above, which provide a balance of SDRAM READ vs. WRITE operations at the transmit end. FIG. 7B illustrates the key process steps of deinterleaving at the receive end a coded and interleaved signal generated by the process and apparatus at the transmit end.

What is claimed is:

1. Apparatus for transmitting a transmission payload data bit-stream through an optical free-space medium, said apparatus comprising:
    means for encoding an optical transmission payload data bit-stream into codewords using Reed-Solomon encoding;
    means for fragmenting said codewords into sequences of segments;
    a buffer store comprising SDRAM devices for storing physical pages,
        each said SDRAM device having a cycle rate including a READ rate and a WRITE rate, said SDRAM device being both readable and writable at said cycle rate, and
        each said SDRAM device matrix of memory cells having a defined repeating x-y row-column submatrix, each for containing a single one of said physical pages;
    means for interleaving successive blocks of codeword segments into successive said x-y submatrices in WRITE operations having a first page-change overhead operation;
    means for READING out codeword segments from said x-y submatrices in READ operations having a second page-change overhead operation, to create an encoded and interleaved data-bit stream;
    means for addressing said WRITE and said READ operations into and out of said submatrices to substantially redistribute said first page-change overhead operation to said second page-change overhead operation, thereby to equalize the rate of said WRITE and said READ operations; and
    means for transmitting said encoded and interleaved data-bit stream into said optical free space medium.

2. Apparatus in accordance with claim 1, further comprising
    means for WRITING K-consecutive entries of said blocks of codeword segments into each one of said submatrices; and
    means for changing pages in said READ operations at a rate determined by the number of said consecutive entries K.

3. Apparatus in accordance with claim 2, wherein said means for addressing said WRITE and READ operations further comprises:
    means for WRITING into successive said columns of said submatrix cells corresponding segments of successive said codewords comprising a SDRAM page; and
    means for remapping said submatrix cell addresses for READout to maintain the number of said columns held on one said page to a number that ensures a physical SDRAM page change at intervals which make said READ and WRITE rates substantially equal.

4. Apparatus in accordance with claim 3, wherein each said submatrix is a square, the dimensions of each side of said square being equal to the square root of the number of said codewords comprising each said physical page.

5. Apparatus in accordance with claim 2 further comprising
    means for receiving said codeword segments for entry into said submatrices by row; and
    means for effecting a said physical SDRAM page change following completion of the number of said entries by row that equalizes said first and said second page-change overhead operations.

6. Apparatus in accordance with claim 5, further comprising:
    means for sensing conditions in said medium which cause scintillation effects; and
    means for activating said encoding and said interleaving steps when said conditions are detected.

7. Apparatus in accordance with claim 6, further comprising:
    a remote receiver, said receiver comprising means for deinterleaving and decoding said encoded and interleaved data-bit stream.

8. Apparatus in accordance with claim 7, wherein
    said SDRAM devices comprise storage cell capacity sufficiently large to correct an error burst of the order of 20 million bits.

9. Apparatus in accordance with claim 8, wherein
    said Reed-Solomon code is of the (255,223) format.

10. Apparatus in accordance with claim 9, wherein
    said encoding means encodes said transmission payload data-bit stream into blocks of substantially 156,250 codewords to be interleaved.

11. Apparatus in accordance with claim 10, wherein
    said codeword size is substantially 2040 bits.

12. Apparatus in accordance with claim 11, wherein
    said fragmenting means segments each said codeword into substantially 60-bit segments for interleaving in said submatrices of said SDRAM devices.

13. Apparatus for transmitting a transmission payload data bit-stream through an optical free-space medium, said apparatus comprising:
    means for encoding an optical transmission payload data bit-stream into codewords using Reed-Solomon encoding means for fragmenting each of said codewords into segments;

a SDRAM buffer store having an entry receive and transmit rate and comprising a matrix of memory cells, said matrix of memory cells further comprising a repeating x-y submatrix, each said repeating x-y submatrix being arranged to receive a plurality of said segments comprising a single SDRAM physical page;

means for effecting a WRITE operation to interleave corresponding segments of successive said codewords into each said repeating x-y submatrix of said memory cells;

said WRITE operation having an associated first page-change overhead operation, means for effecting a READ operation to read out each said repeating x-y submatrix of said memory cells;

said READ operation having an associated second page-change overhead operation, said WRITE and said READ operations into and out of each said repeating x-y submatrix of said memory cells being conducted to substantially redistribute page change overhead operations from said WRITE operation to said READ operation, thereby to equalize the rate of said WRITE and READ operations; and means for transmitting the interleaved said segments into said optical free-space medium.

* * * * *